United States Patent [19]
Marchetti

[11] Patent Number: 5,533,631
[45] Date of Patent: Jul. 9, 1996

[54] COMPOSITE PRINTED CIRCUIT CARD GUIDE AND HOLDING DEVICE

[75] Inventor: Richard J. Marchetti, Milford, Del.

[73] Assignee: Unitrack Industries, Inc., Milford, Del.

[21] Appl. No.: 321,740

[22] Filed: Oct. 12, 1994

[51] Int. Cl.[6] .................................................. A47G 19/08
[52] U.S. Cl. ........................................ 211/41; 361/756
[58] Field of Search ............................. 211/41; 361/741, 361/756, 753, 799, 800, 801, 802; 493/61

[56] References Cited

U.S. PATENT DOCUMENTS

| | | | |
|---|---|---|---|
| 3,231,785 | 1/1966 | Calabro | 317/100 |
| 3,476,982 | 11/1969 | Bell et al. | 361/802 |
| 3,878,438 | 4/1975 | Weisman | 361/802 |
| 3,899,721 | 8/1975 | Borchard et al. | 361/802 |
| 3,950,057 | 4/1976 | Calabro | 361/802 |
| 4,007,403 | 2/1977 | Fiege | 361/756 |
| 4,019,099 | 4/1977 | Calabro | 211/41 |
| 4,022,326 | 5/1977 | Marconi | 211/41 |
| 4,096,547 | 6/1978 | Calabro | 361/388 |
| 5,187,648 | 2/1993 | Ito | 211/41 |

OTHER PUBLICATIONS

Tauras Corporation, Circuitrak Printed Circuit Board Holders, Mar. 1975, pp. 2 & 3.

*Primary Examiner*—Karen J. Chotkowski
*Assistant Examiner*—Anita M. King
*Attorney, Agent, or Firm*—Anthony J. Casella; Gerald E. Hespos

[57] ABSTRACT

A composite printed circuit card guide and holding device including a rigid, U-shaped support member which slidably receives a printed circuit card engaging means is provided with slots adjacent the ends thereof for receiving the respective ends of the engaging means in order to inhibit relative movement between the support member and the engaging means. The interengagement of the ends of the engaging means and the support means also provides an obstruction-free entry into the card guide and holding device for enabling the smooth sliding entry of a printed circuit card into the subject device. In addition, the opposite end walls of the U-shaped support member are tapered to afford easy access to mounting holes provided in the base of the support member for facilitating mounting of the composite device to a cage or the like.

8 Claims, 4 Drawing Sheets

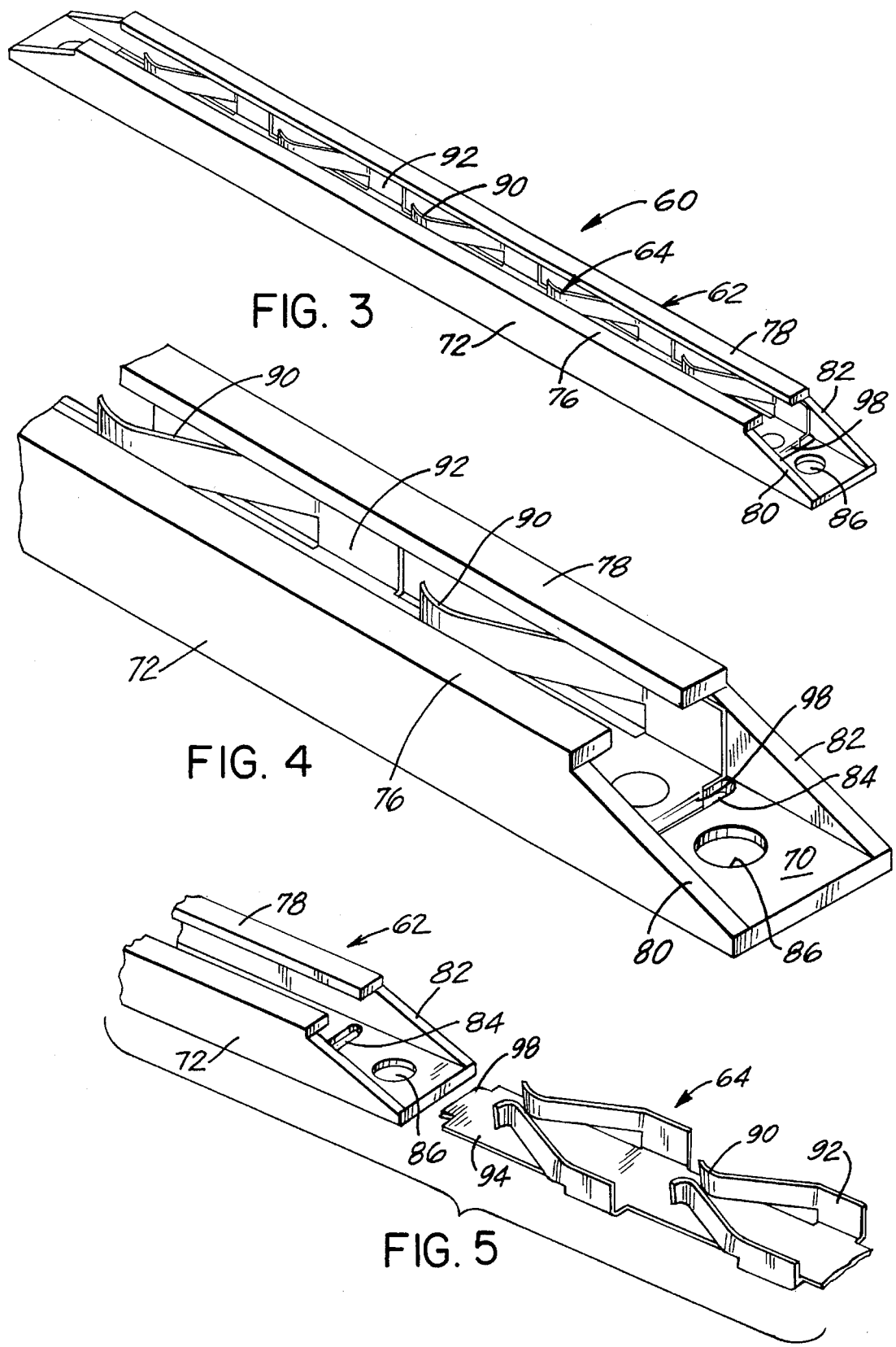

COMPOSITE PRINTED CIRCUIT CARD GUIDE AND HOLDING DEVICE

BACKGROUND OF THE INVENTION

The present invention relates to an improved mounting and fastening device for modular panels, boards or cards which, in turn, mount circuits such as printed circuits, within a panel rack or cage utilized in connection with electronic equipment or the like.

The present invention is an improvement in the "COMPOSITE PRINTED CIRCUIT CARD GUIDE AND HOLDING DEVICE" disclosed in U.S. Pat. No. 3,950,057 which issued on Apr. 13, 1976 to Anthony D. Calabro, and which is assigned to the assignee of the subject application, as well as an improvement to the invention disclosed in U.S. Pat. No. 4,096,547 which issued to Anthony D. Calabro on Jun. 20, 1978, and is entitled "HEAT TRANSFER MOUNTING DEVICE FOR METALLIC PRINTED CIRCUIT BOARDS", which patent is also assigned to the assignee of the subject application. The disclosures of U.S. Pat. Nos. 3,231,785, 3,950,057 and 4,096,547 are incorporated herein by reference.

In connection with the mounting of printed circuit boards and the like, reference is made to U.S. Pat. No. 3,231,785 which issued on Jan. 25, 1966 and is entitled "CIRCUIT BOARD MOUNTING DEVICE", also assigned to the assignee of the subject invention, which discloses the basic concept of an integral holding device which includes unitary spring fingers for securing the above-mentioned panels, such as printed circuit boards, within a rack or cage mounting. For applications where the printed circuit board or panel is on the order of seven or eight inches, the unitary circuit board mounting device disclosed in said U.S. Pat. No. 3,231,785 is excellent for maintaining a printed circuit board in place, even in the presence of shock and vibration. The patented printed circuit board mounting device of U.S. Pat. No. 3,231,785 is of unitary construction, preferably of a plastic material which, over a relatively short length of approximately eight inches, is fairly rigid in order to securely hold the printed circuit panel. However, with advanced technology, it has been found that there are requirements for mounting large size printed circuit boards, on the order of two to three feet, in a stable condition, and in a manner so as to provide support for the board for spanning large open spaces. In addition, considering the number of components mounted on the board, there is a great need for providing means in the form of heat conducting surfaces for achieving good heat transfer from the printed circuit board to the surrounding structure or atmosphere. Still further, in certain applications it is desirable that the circuit board mounting device should also provide electrical grounding for the printed circuit board. Another feature which is often desired is to provide spacer or gage means for assisting the spring finger dampening means from overstressing the fingers due to vibrations of the printed circuit board brought about by either mechanical vibrations in the chassis of the electronic system, or by the vibrations created in the printed circuit board when electrical power is applied thereto.

U.S. Pat. No. 3,950,057 entitled "COMPOSITE PRINTED CIRCUIT CARD GUIDE AND HOLDING DEVICE" which issued on Apr. 13, 1976, and is assigned to the assignee of the subject application, achieves the objectives set forth above. U.S. Pat. No. 3,950,057 discloses a composite printed circuit card guide and holding device comprising a U-shaped elongated member made of a rigid material, and including two upstanding arm members having inwardly directed flanges which are spaced a sufficient distance to enable the passage therethrough of the edge of a printed circuit card. Printed circuit card engaging means are slidably received within the U-shaped member, which printed circuit card engaging means includes a plurality of opposed, cantilevered flexible spring fingers extending into the region where the printed circuit card is mounted, thereby resiliently engaging and holding the printed circuit card. With the U-shaped elongated member being made of a rigid material, such as an extruded metallic material, such as aluminum, and with the printed circuit card engaging means formed of a flexible plastic material, there is achieved a composite printed circuit card guide and holding device which is rigid for maintaining and holding a large printed circuit board that spans over large open spaces; which inherently includes good heat conduction characteristics for transferring heat from the printed circuit board to the surroundings; and which device is made of good electrically conducting material so as to provide the capability of grounding the printed circuit board, when required.

A further improvement in the composite printed circuit card guide and holding device is disclosed in U.S. Pat. No. 4,096,547 which issued on Jun. 30, 1978 to Anthony D. Calabro and is entitled "HEAT TRANSFER MOUNTING DEVICE FOR METALLIC PRINTED CIRCUIT BOARDS", and which is assigned to the assignee of the subject invention. The printed circuit board guide and holding device of U.S. Pat. No. 4,096,547 is particularly adapted for use with metallic printed circuit boards, and has improved heat transfer capabilities comprising an elongated heat transfer support member which is adapted to receive the printed circuit board engaging means. The heat transfer support member is of generally U-shaped cross section and is made of metallic material, with the upstanding arms including spaced flanges to enable the passage therethrough of the edge of the printed circuit board. One of said flanges includes a depending heat conductive element that is adapted to directly engage and be in intimate contact with the metallic printed circuit board to facilitate the conductive transfer of heat from the board to the support member.

Notwithstanding the efficient operation of the composite printed circuit guides described in U.S. Pat. Nos. 3,950,057 and 4,096,547, it has been found desirable to provide further improvements to a composite circuit board guide in several respects. In one aspect, it has been found that, occasionally, because of the frictional interengagement between the U-shaped elongated member and the printed circuit card engaging means, when a printed circuit board is removed from a cage or the like, the frictional force holding the card engaging means in the U-shaped member is less than the pulling force applied to the printed circuit card, and as a result the printed circuit card engaging means are inadvertently removed from the U-shaped elongated member, along with the printed circuit board. In order to overcome this shortcoming, the subject invention provides a new and unique interconnection between the printed circuit card engaging means and the U-shaped elongated member, thereby obviating inadvertent removal of the circuit card engaging means from the U-shaped elongated member.

In a second aspect, in the prior art system as disclosed in U.S. Pat. No. 3,950,057, in order to attach the composite printed circuit card guide and holding device to a cage or the like, a separate, discrete clip is provided for interconnecting the U-shaped elongated member to the cage structure. In order to provide a simpler, more efficient interconnection between the composite printed circuit card device and the cage, the U-shaped elongated member of the subject invention includes unique end structures, whereby opposed distal ends of the U-shaped elongated member include unitary means for attaching the composite holding device to the cage, without the use of a separate discrete member, thereby aiding in more rapid assembly and efficient operation of the composite printed circuit card guide and holding device.

In a third aspect, in the prior art systems as disclosed in U.S. Pat. Nos. 3,950,057 and 4,096,547, the opposite ends of the base of the U-shaped printed circuit card engaging means are disposed over the base of the U-shaped elongated member thereby forming steps or obstructions to the smooth entry of a printed circuit board being slidably inserted into the composite board guide. The subject invention overcomes this problem since the opposite ends of the U-shaped printed circuit card engaging means are received within slots in the elongated member thereby ensuring an unobstructed smooth entry of the printed circuit board into the composite guide and holding device of the subject invention.

Accordingly, it is the object of the subject invention to provide a new and improved composite printed circuit card guide and holding device wherein the printed circuit card engaging means is interengaged and connected to the elongated U-shaped member in order to prevent disengagement of the engaging means from the elongated member, and to ensure smooth entry of a printed circuit board into the subject guide and holding device.

It is a further object of the subject invention to provide a new and improved U-shaped elongated member that includes tapered distal ends, with an aperture being provided in each distal end to accommodate attachment of the U-shaped elongated member to the printed circuit board cage or other assembly without the requirement of a discrete clip, as in the prior art systems.

SUMMARY OF THE INVENTION

The composite printed circuit card guide and holding device of the subject invention includes an elongated, rigid U-shaped support member in which is slidably received a printed circuit card engaging means. The elongated, rigid U-shaped support member includes a base and two upstanding arm members, with inwardly directed flanges extending from each upstanding arm and spaced a sufficient distance to enable the passage therethrough of the edge of the printed circuit card. Preferably, an elongated slot is disposed adjacent each end of the elongated U-shaped member for respectively receiving the distal end of the printed circuit card engaging means. The latter includes a plurality of opposed, cantilevered, flexible spring fingers extending into the region wherein the printed circuit card is received so as to resiliently engage and hold the card. Each opposite end of the printed circuit card engaging means is bent in a manner so as to be disposed in and thus interengage the respective slot in the distal end of the rigid U-shaped support member, thereby inhibiting movement of the printed circuit card engaging means relative to the elongated, rigid U-shaped support member, and to ensure smooth entry of the printed circuit board into the subject card and guide and holding device.

A further feature of the new and improved composite printed circuit card guide and holding device of the subject invention is to provide unitary mounting means for the printed circuit card guide to the cage. More particularly, the distal end of the U-shaped member is configured to have tapered side walls, with a mounting hole being provided at each end intermediate the slot in which the printed circuit card engaging means is connected, and the distal end of the rigid, U-shaped support member. The tapered end walls of the U-shaped support member allow ready access to the hole adjacent the distal end of each support member for passing of a screw or similar fastening means through the U-shaped support member to a complimentary hole in the printed circuit board cage or the like for fixedly connecting of the composite printed circuit card guide to the cage.

The features of the subject invention are also applicable to a card guide and holding device wherein the U-shaped support member is configured to include a heat conductive element depending from one of the spaced flanges of the support member, similar to the configuration of the support member as disclosed in U.S. Pat. No. 4,096,547. In such application, in addition to enhanced heat transfer characteristics, the subject card guide and holding device will function to inhibit relative movement between the printed circuit board engaging device and the U-shaped support member, provide smooth and efficient entry of the printed circuit board into the subject device, and incorporate unitary holding means for connection of the subject device to a cage or the like.

These and other features of the present invention will be more fully appreciated when considered in light of the following specification and drawings.

BRIEF DESCRIPTION OF DRAWINGS

FIG. 3 is a prospective view of the composite printed circuit card guide and holding device of the subject invention.

FIG. 4 is an enlarged view of one end of the composite printed circuit card guide and holding device according to the subject invention.

FIG. 5 is an exploded, prospective view of the composite printed circuit card guide and holding device according to the subject invention including the elongated, rigid U-shaped support member and the printed circuit card engaging means.

DETAILED DESCRIPTION OF THE PREFERRED EMBODIMENTS

Figure 1:
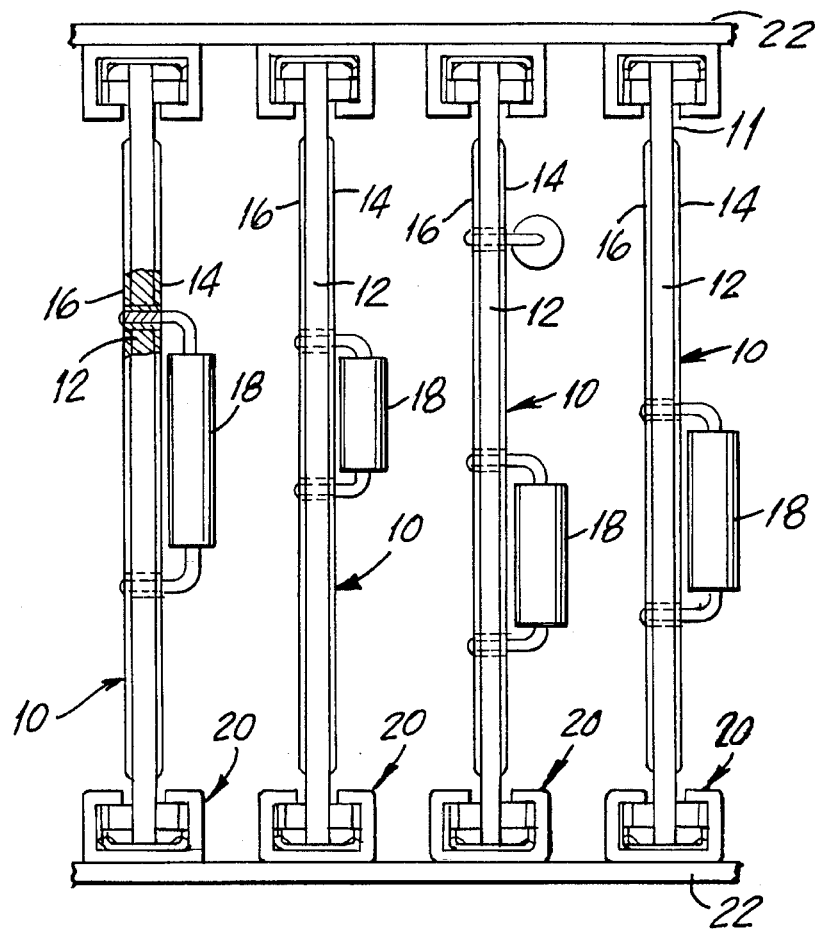
FIG. 1 is a side view of-a printed circuit board cage structure wherein a plurality of printed circuit boards are engaged by mounting devices made according to the prior art.
Figure 2:
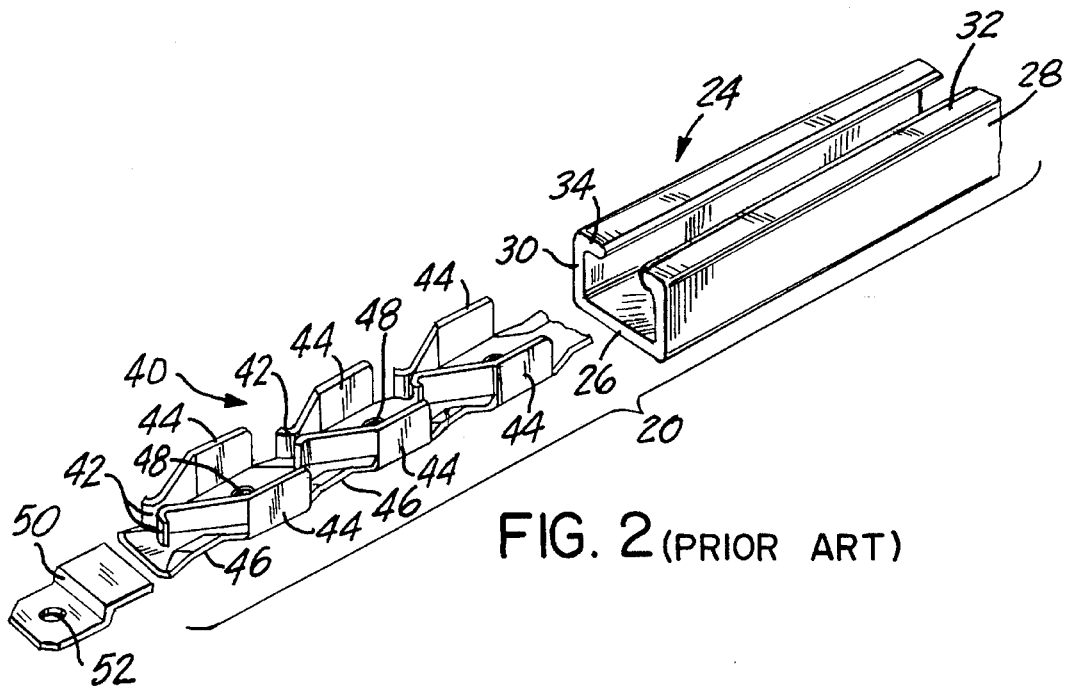
FIG. 2 is an exploded view of a printed circuit board cage structure according to the prior art.
Figure 8:
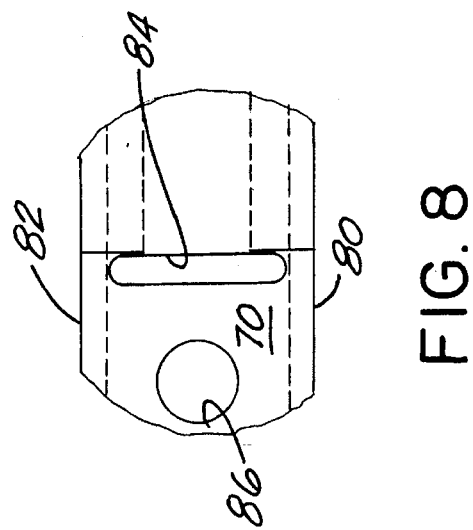
FIG. 8 is a detailed view of a distal end of the U-shaped support member as shown in FIG. 8.
Figure 6:
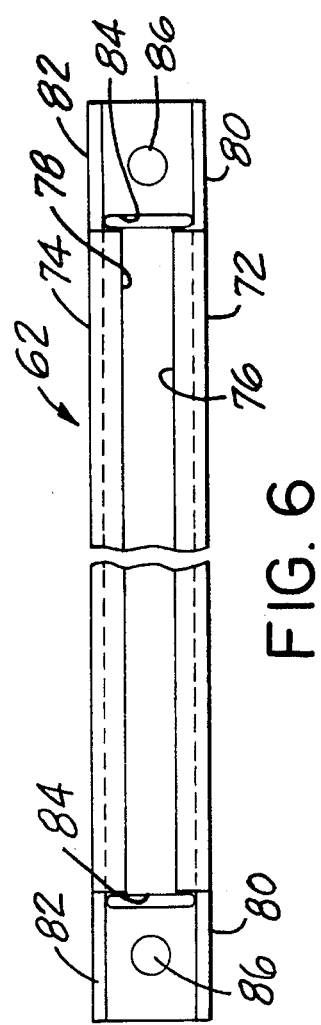
FIG. 6 is a plan view of the elongated, rigid U-shaped support member forming a portion of the composite printed circuit card guide and holding device of the subject invention.
Figure 7:
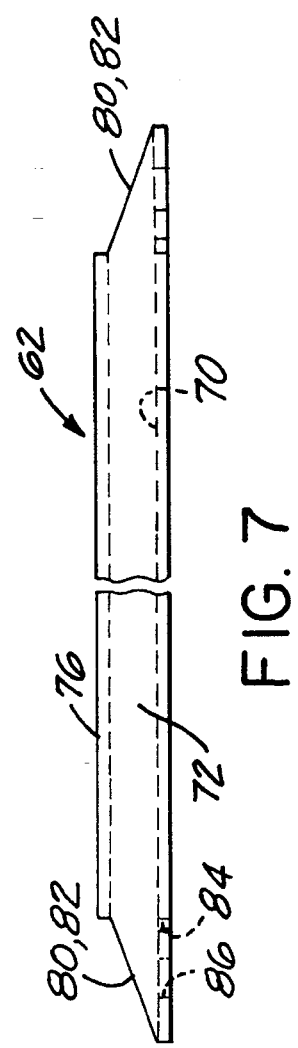
FIG. 7 is a side elevational view of the U-shaped support member as shown in FIG. 6.
Figure 9:
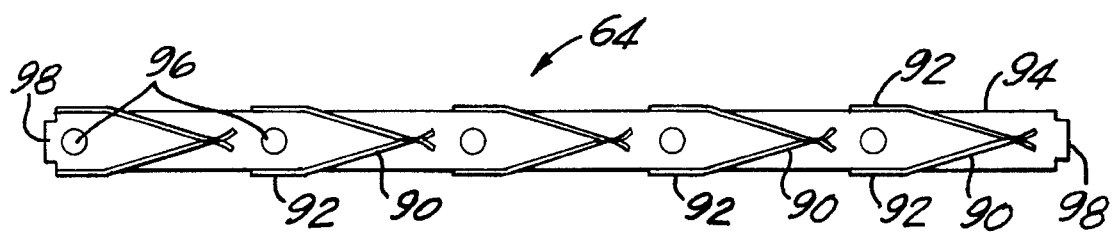
FIG. 9 is a plan view of the printed circuit card engaging means of the composite printed circuit card guide and holding device of the subject invention.
Figure 10:
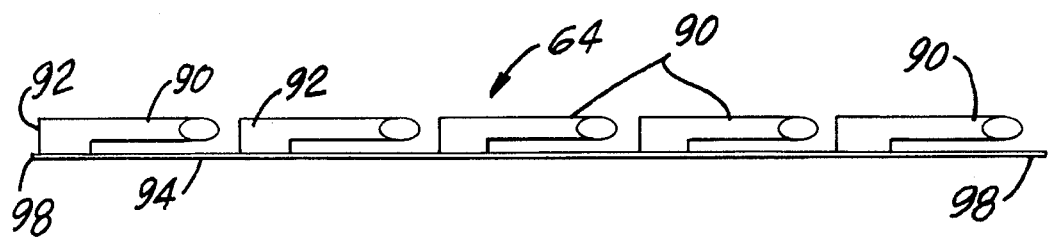
FIG. 10 is a side elevational view of the printed circuit card engaging means as shown in FIG. 9.

FIGS. 1 and 2 illustrate a prior art printed circuit guide and holding device, of the type as disclosed in U.S. Pat. Nos. 3,950,057 and 4,096,547, as described above. As shown in FIG. 1, a plurality of metallic printed circuit boards, designated by the numeral 10, are held by mounting devices 20 which, in turn, are secured to metallic sheets 22 forming a portion of a rack or cage of standard design. Each metallic printed circuit board 10 basically comprises a metallic substrate 12 to which is laminated on the opposite faces thereof thin plastic film or sheets 14, 16. As in conventional constructions, the printed circuit boards 10 are usually of rectangular configuration, and the opposite edges of the boards 10 are engaged by mounting devices 20. The thin plastic sheets 14, 16 extend over the surface of the metallic substrate to the extend of covering the substrate, except for the opposite edge portions 11 of the metallic substrates which are engaged by the mounting devices 20. Disposed on one or both surfaces of the laminated printed circuit board are lead lines and other electronic circuitry, and also electrical components 18, in conventional fashion. The mounting devices 20 may be secured to the metallic sheets 22 of the cage by suitable means such as rivets, screws or other similar devices through the use of a holding clip 50, as described in more detail below. The mounting devices 20 extend along the entire length or edge of the printed circuit board 10, and function to rigidly engage and hold the metallic printed circuit boards 10, even in the presence of shock and vibration, and in addition may include means so as to function as a heat sink for the conductive dissipation of heat developed in the printed circuit board, especially when the mounting devices are of the type as disclosed in U.S. Pat. No. 4,096,547.

As shown in FIG. 2, each prior art mounting device 20 basically comprises an elongated, generally U-shaped support member 24 which is adapted to receive a printed circuit board engaging means, designated by the numeral 40. The support member 24 is of generally U-shaped cross section including a base 26 and upstanding arms 28, 30. Extending from the distal ends of the upstanding arms 28, 30 are inwardly directed flanges 32, 34 which are spaced a sufficient distance to enable the passage therethrough of the edges 11 of the printed circuit boards 10. The support member 24 is preferably made of a heat conductive material, such as aluminum, which might be readily extruded to the desired configuration.

The prior art card engaging means 40, as shown in FIG. 2, is likewise of generally U-shaped configuration, and is preferably formed of a spring temper beryllium copper, phosphor bronze or stainless steel. The engaging means 40 is preferably stamped and formed from a relatively thin sheet of metallic material, with the thickness of the metallic sheet being less than the thickness of the walls of the extruded member 24. The printed circuit guide engaging means 40 is formed so as to define opposed cantilevered spring fingers 42. Intermediate the supporting walls 44 for the spring fingers 42, the metal strip forming the printed circuit guide engaging means 40 is indented as at 46 in order to add additional longitudinal rigidity to the means 40. The vertical height of each spring finger 42 is less than the total height of the upstanding supporting wall 44 in order to provide additional material for formation of the indentation 46. Apertures 48 may be provided in the base of the engaging means 40. The printed circuit board engaging means 40 of the prior art is slidably received within the confines of the support member 24.

Holding clip 50 includes an aperture 52, and the holding clip is slidably received within the support member 24, with one end of the clip 50 being disposed intermediate the base of the means 40 and the base 26 of the support member 24. Each holding clip 50 is provided with an aperture 52 for receiving a fastening means for connection to the cage.

As noted above, by virtue of the construction of the prior art composite printed circuit guide as shown in FIGS. 1 and 2, it is clear that there is no positive interengagement between the support member 24 and the printed circuit board engagement means 40. Accordingly, when a printed circuit board 10 is removed from the cage 22, depending on the frictional forces between the various elements, it is possible that the printed circuit engaging means 40 may be removed from the support means 24 along with the printed circuit board as it is slidably removed from the cage. In addition, another shortcoming of the prior art is that it requires a clip 50 which is separate and discrete from the support member 24, and thus adds to the cost of the assembly, both from a material point of view as well as the cost of assembling the assembly to the cage 22. Still further, because the base of the U-shaped printed circuit card engaging means 40 is disposed on the base 26 of the support member 24, the opposite ends of the engaging means 40 form a step or obstruction to the smooth entry of a printed circuit card 10 into the mounting devices 20.

FIGS. 3 through 10 illustrate the new and improved composite printed circuit card guide and holding device of the subject invention. As shown in FIGS. 3 through 5, the composite printed circuit card guide and holding device of the subject invention is generally designated by the numeral 60, and includes an elongated, rigid U-shaped support member 62 which slidably receives the printed circuit card guide engaging means 64.

Referring to FIGS. 3 through 8, the rigid U-shaped support member 62 is preferably made of an extruded aluminum material, of unitary construction. Support member 62 is of generally U-shaped cross section including a base 70 and upstanding arms 72, 74. Extending from the distal ends of the upstanding arms 72, 74 are inwardly directed flanges 76, 78 which are spaced a sufficient distance to enable the passage therethrough of the edges 11 of the printed circuit boards 10. The opposed ends of the respective side wall arms 72, 74 are tapered as shown at 80, 82, and a longitudinally extending slot 84 is provided in the base 70 at the opposite ends of the U-shaped support member 62. As particularly shown in FIGS. 6 and 8, the longitudinal axis of each slot 84 extends generally perpendicular to the longitudinal axis of the U-shaped support member 62. In addition, as more particularly shown in FIGS. 6 and 8, an aperture 86 is provided in the base 70 of the U-shaped support member 62 intermediate the distal end of the support member 62 and the elongated slot 84.

The printed circuit board engaging means 64 of the subject invention is illustrated in FIGS. 3–5 and 9–10, and is likewise of generally U-shaped configuration, and is preferably formed of a spring temper beryllium copper, phosphor bronze or stainless steel. The printed circuit board engaging means 64 is preferably stamped and formed from a relatively thin sheet of metallic material, and is formed so as to define opposed cantilevered spring fingers 90 extending from intermediate supporting walls 92. The base 94 of the printed circuit board engaging means 64 includes a plurality of spaced holes 96.

In order to enable interconnection between the printed circuit board engaging means 64 and the U-shaped support member 62, and to facilitate the smooth sliding entry of the board in device 60, the opposite ends of the base 94 of the printed circuit board engaging means 64 includes tabs, designated by the numerals 98 which, in the assembly of the composite printed circuit card guide and holding device 60, are bent downwardly so as to interengage with the slots 84, as more particularly shown in FIGS. 3 and 4. In the assembly of the composite printed circuit card guide and holding device, the mounting holes 86 in the base of the U-shaped support member 62 are readily accessible because of the tapered side walls 80, 82 of the support member 62.

Accordingly, there is provided a new and improved composite printed circuit board guide and holding device which is constructed in a manner so as to ensure positive interengagement of the printed circuit board engaging means 64 with the support structure 62 thereby inhibiting the inadvertent removal of the engaging means 64 as a printed circuit board is removed from the guide, and also the support member 62 is constructed in a unique manner so as to provide opposite tapered ends which facilitate connection of the composite guide to the cage. In addition, the interengagement of the opposite ends 98 of the base 94 with the slots 84 define smooth and obstruction-free entry for a printed circuit board as it is slidably loaded into the guide and holding device 60. As is readily apparent, numerous modifications and changes may readily occur to those skilled in the art, and hence it is not desired to limit the invention to the exact construction and operation shown and described, and accordingly all suitable modifications and equivalents may be resorted to, falling within the scope of the invention as claimed.

What is claimed is:

1. A composite printed circuit card guide and holding device including an elongated, rigid U-shaped support member having a planar base with a longitudinal axis, two spaced apart upstanding arm members extending from said base, and flanges extending toward one another from locations on each upstanding arm spaced from said base, said flanges being spaced from one another a sufficient distance to enable passage therethrough of the printed circuit card, and printed circuit card engaging means slidably received within said rigid U-shaped support member, said printed circuit card engaging means including an elongated base supported on the base of the rigid U-shaped support member and a plurality of opposed, cantilevered, flexible spring fingers extending toward one another from said base and between the arms of the rigid U-shaped support member to resiliently engage and hold said printed circuit card, wherein:

said elongated, rigid U-shaped support member includes at least one slot disposed in the base adjacent at least one end of said elongated, rigid U-shaped support member, said slot having a longitudinal axis substantially orthogonal to the longitudinal axis of said base, and wherein said printed circuit card engaging means includes at least one tab extending from at least one end of said elongated base of said circuit card engaging means, said tab being disposed in said slot thereby inhibiting movement of said printed circuit card engaging means relative to said elongated, rigid U-shaped support member, and facilitating smooth sliding entry of a printed circuit card into the card guide and holding device.

2. A composite printed circuit card guide and holding device as in claim 1, wherein said at least one slot comprises a pair of slots disposed respectively adjacent each end of said elongated rigid U-shaped support member, and wherein both opposed ends of said printed circuit card engaging means comprise said tabs disposed respectively in said slots.

3. A composite printed circuit card guide and holding device as in claim 1, wherein said printed circuit card engaging means comprises a strip of flexible metal formed in generally U-shaped cross-section to include a base, upstanding arms and opposed, cantilevered flexible spring fingers projecting from said upstanding arms.

4. A composite printed circuit card guide and holding device as in claim 3, wherein the base of said printed circuit card engaging means includes a plurality of spaced apertures disposed along the length thereof.

5. A composite printed circuit card guide and holding device as in claim 3, wherein the height of each cantilevered spring finger is less than the height of its associated upstanding arm.

6. A composite printed circuit card guide and holding device as in claim 3, wherein said strip of flexible metal is made of beryllium copper.

7. A composite printed circuit card guide and holding device as in claim 3, wherein said strip of flexible metal is made of phosphor bronze.

8. A composite printed circuit card guide and holding device as in claim 1, wherein said upstanding arm members have tapered ends, and wherein the base of said U-shaped support member includes a hole adjacent each end thereof for enabling connection of said composite printed circuit card guide and holding device to a cage for the printed circuit cards.

* * * * *